(12) United States Patent
Kim et al.

(10) Patent No.: US 7,584,817 B2
(45) Date of Patent: Sep. 8, 2009

(54) ELECTRIC POWER STEERING APPARATUS FOR AUTOMOBILE

(75) Inventors: Jongkwan Kim, Yongin-si (KR); Heeseok Oh, Anseong-si (KR); Sangwhi Han, Yongin-si (KR)

(73) Assignee: Mando Corporation, Pyeongtaek-si (KR)

( * ) Notice: Subject to any disclaimer, the term of this patent is extended or adjusted under 35 U.S.C. 154(b) by 493 days.

(21) Appl. No.: 11/311,816

(22) Filed: Dec. 19, 2005

(65) Prior Publication Data
US 2007/0089927 A1 Apr. 26, 2007

(30) Foreign Application Priority Data
Oct. 26, 2005 (KR) ............... 10-2005-0101340

(51) Int. Cl.
*B62D 5/04* (2006.01)
(52) U.S. Cl. .................. 180/444; 361/704; 361/719
(58) Field of Classification Search ......... 361/701–702, 361/704, 719, 720, 736, 760; 180/444
See application file for complete search history.

(56) References Cited

U.S. PATENT DOCUMENTS

| | | | |
|---|---|---|---|
| 4,218,724 A | | 8/1980 | Kaufman |
| 5,031,071 A | | 7/1991 | Seibert et al. |
| 5,045,971 A | * | 9/1991 | Ono et al. .................. 361/704 |
| 5,663,869 A | * | 9/1997 | Vinciarelli et al. ......... 361/707 |
| 6,097,603 A | * | 8/2000 | Edwards et al. ............ 361/719 |
| 6,201,700 B1 | | 3/2001 | Tzinares et al. |
| 6,211,631 B1 | * | 4/2001 | Wilson-Jones et al. ....... 318/12 |
| 6,549,414 B1 | * | 4/2003 | Tokuhara et al. ............ 361/719 |
| 6,707,671 B2 | * | 3/2004 | Yamashita et al. .......... 361/704 |
| 6,833,997 B1 | * | 12/2004 | Jones et al. ................ 361/760 |
| 7,113,406 B1 | * | 9/2006 | Nguyen et al. .............. 361/719 |
| 7,190,589 B2 | * | 3/2007 | Caines et al. ............... 361/707 |

(Continued)

FOREIGN PATENT DOCUMENTS

EP 0463589 A2 1/1992

(Continued)

OTHER PUBLICATIONS

European Search Report for Application No. 05257818.4—1264, dated Nov. 14, 2006.

*Primary Examiner*—Lesley D. Morris
*Assistant Examiner*—Maurice Williams
(74) *Attorney, Agent, or Firm*—Lahive & Cockfield, LLP; EuiHoon Lee (57) ABSTRACT

Disclosed is an electric power steering apparatus having an electronic control device for controlling motor current based on electric signals inputted from a torque sensor of an automobile and a motor for generating steering power. The electronic control device includes a PCB; a metal substrate formed on a lower side of the PCB in a plate shape while being perpendicular to the PCB; a heating device having a terminal coupled to the PCB and a body coupled to a front surface of the metal substrate; and a radiation plate spaced a predetermined distance from the PCB and having a coupling unit formed on an upper surface of the radiation plate, the metal substrate being coupled to the coupling unit. The body of the heating device is coupled to the metal substrate, which is perpendicular to the PCB, and the metal substrate is coupled to the coupling unit on the upper surface of the radiation plate for improved radiation function.

8 Claims, 6 Drawing Sheets

U.S. PATENT DOCUMENTS

| | | | |
|---|---|---|---|
| 7,262,973 B2* | 8/2007 | Nakashima et al. | 361/760 |
| 2003/0002260 A1* | 1/2003 | Hasebe et al. | 361/720 |
| 2003/0153665 A1* | 8/2003 | Tobita et al. | 524/404 |

FOREIGN PATENT DOCUMENTS

| | | |
|---|---|---|
| EP | 0572011 A1 | 12/1993 |
| EP | 0733536 A2 | 9/1996 |
| EP | 1342305 B1 | 9/2003 |
| JP | 47-3658 | 9/1972 |
| JP | 6-270824 | 9/1994 |
| JP | 10-270632 | 10/1998 |
| JP | 2000-203437 | 7/2000 |
| JP | 2003-86970 | 3/2003 |
| JP | 2003-267233 | 9/2003 |
| JP | 2004-74831 | 3/2004 |

* cited by examiner

ELECTRIC POWER STEERING APPARATUS FOR AUTOMOBILE

RELATED APPLICATION

This application claims priority to Korean Patent Application No. 2005-101340 filed on Oct. 26, 2005.

FIELD OF THE INVENTION

The present invention relates to an electric power steering apparatus for an automobile. More particularly, the present invention relates to an electric power steering apparatus for an automobile having an electronic control device including a PCB, a metal substrate perpendicular to the PCB, a heating device having a body coupled to the metal substrate, and a radiation plate having a coupling unit on its upper surface, to which the metal substrate is coupled, for improved radiation function.

BACKGROUND OF THE INVENTION

As generally known in the art, power steering apparatuses for automobiles include a hydraulic power steering apparatus utilizing hydraulic pressure of a hydraulic pump, which has been used since its initial introduction, and an electric power steering apparatus utilizing an electric motor, use of which has been gradually universalized since the 1990's.

In the existing hydraulic power steering apparatus, a hydraulic pump, which is a power source for supplying steering power, is driven by an engine, which causes the hydraulic pump to continuously consume energy regardless of whether or not the steering wheel is being rotated. In the electric power steering apparatus, when steering torque is generated by rotation of a steering wheel, a motor supplies steering power in proportion to the generated steering torque. Therefore, in energy efficiency terms, the electric power steering apparatus is more advantageous than the hydraulic power steering apparatus.

Figure 1:
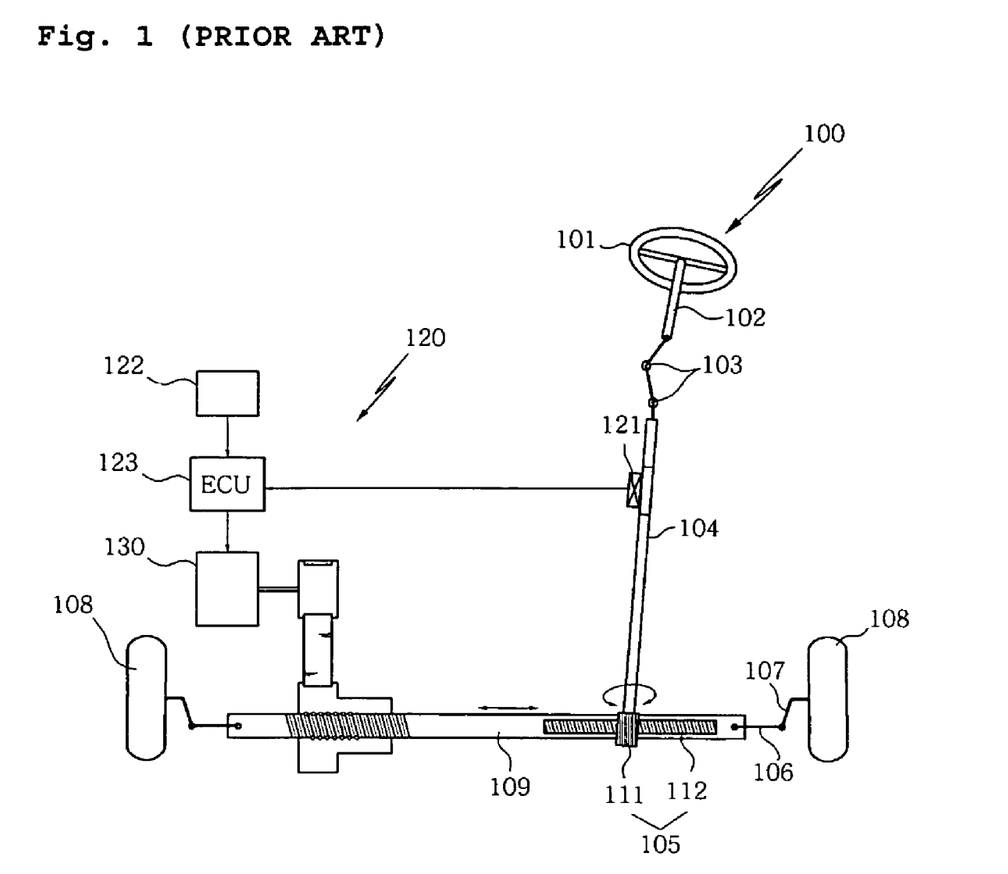
FIG. 1 shows the construction of an electric power steering apparatus for an automobile according to the prior art.

FIG. 1 illustrates the construction of a conventional electric power steering apparatus.

As shown in FIG. 1, a conventional electric power steering apparatus for an automobile includes a steering system 100, which includes elements from a steering wheel 101 to both wheels 108, and a steering power mechanism 120 for supplying steering power to the steering system 100.

The steering system 100 includes a steering shaft 102 having an upper end connected to the steering wheel 101, so that the steering shaft 102 rotates together with the steering wheel 101, and a lower end connected to a pinion shaft 104 via a pair of universal joints 103. The pinion shaft 104 is connected to a rack bar 109 via a rack-pinion mechanism 105. Both ends of the rack bar 109 are connected to the wheels 108 via tie rods 106 and knuckle arms 107.

The rack-pinion mechanism 105 includes a pinion gear 111 formed on the lower end of the pinion shaft 104 and a rack gear 112 formed on a side of the outer peripheral surface of the rack bar 109 to engage with the pinion gear 111. The rack-pinion mechanism 105 converts the rotational motion of the pinion shaft 104 into a linear motion of the rack bar 109. Particularly, when the driver operates the steering wheel 101, the pinion shaft 104 rotates accordingly. The rotation of the pinion shaft 104 causes the rack bar 109 to move linearly in the shaft direction. The linear motion of the rack bar 109 is transmitted to and operates the wheels 108 via the tie rods 106 and the knuckle arms 107.

The steering power mechanism 120 includes a torque sensor 121 for sensing steering torque applied to the steering wheel 101 by the driver and outputting an electric signal in proportion to the sensed steering torque, a velocity sensor 122 for sensing the velocity of the automobile and outputting an electrical signal, an ECU (electronic control unit) 123 for generating a control signal based on the electric signals from the torque sensor 121 and the velocity sensor 122, and a motor 130 for generating steering power based on the control signal from the ECU 123.

The electric power steering apparatus is operated as follows: when the driving wheel 101 is rotated, driving torque is generated and transmitted to the rack bar 109 via the rack-pinion mechanism 105. In addition, the generated steering torque causes the motor 130 to generate steering power, which is transmitted to the rack bar 109. As such, the steering torque generated by the steering system 100 is combined with the steering power generated by the motor 130, so that the rack bar 109 is moved in the shaft direction.

Figure 2:
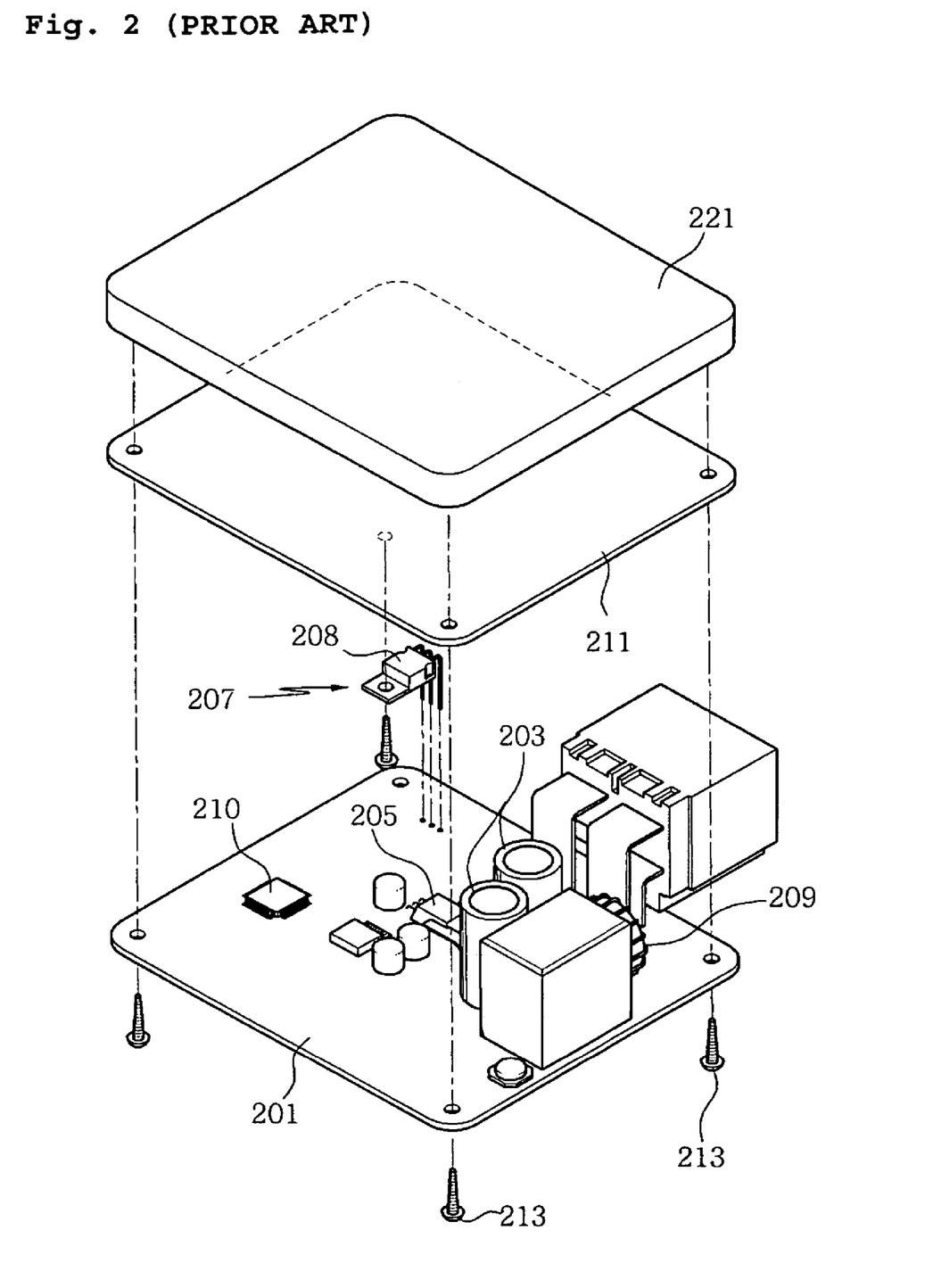
FIG. 2 is an exploded perspective view briefly showing an electronic control device according to the prior art.

FIG. 2 is an exploded perspective view briefly showing an electronic control device according to the prior art.

As shown in FIG. 2, the electronic control device according to the prior art includes a PCB 201, a metal substrate 211, and a radiation plate 221.

The PCB 201 has various components mounted thereon, including a capacitor 203 for absorbing ripple current included in current supplied to a motor; a shunt resistor 205 for sensing the current supplied to the motor; an FET (field effect transistor) 207 for switching the current supplied to the motor based on the size and direction of steering power; a coil 209 for removing electromagnetic noise; and a microcomputer 210 for calculating steering power based on steering torque and the automobile's velocity.

The metal substrate 211 is spaced a predetermined distance from the PCB 201, and a body 208 of the FET 207 is coupled to the upper surface of the metal substrate 211.

The radiation plate 221 is positioned on the bottom surface of the metal substrate 211 and is coupled to the PCB 201 and the metal substrate 211 with bolts 213, in order to radiate heat, which is generated from the body 208 of the FET 207 and transmitted via the metal substrate 211, into the air.

However, the conventional electronic control device, constructed as above, has a problem in that it cannot effectively radiate a large quantity of heat, which is generated by the body 208 of the FET 207 when current necessary to drive the motor flows, because the metal substrate 211 and the radiation plate 221 are stacked on each other.

Any attempt to increase the thickness of the radiation plate 221, in order to improve heat radiation, is limited by spatial restrictions.

When a larger number of FETs 207 are used, their assembly process becomes complicated, because bolts 213 are used to couple respective bodies 208 of the FETs 207 to the metal substrate 211.

SUMMARY OF THE INVENTION

Accordingly, the present invention has been made to solve the above-mentioned problems occurring in the prior art, and an object of the present invention is to provide an electronic control device having a metal substrate and a radiation plate stacked in such a manner that heat is radiated effectively.

Another object of the present invention is to provide an electronic control device having a separate coupling unit on the radiation plate so that the coupling unit can have a large thickness, regardless of spatial restrictions, and heat can be radiated effectively.

Still another object of the present invention is to provide an electronic control device having a heating device (e.g. FET), the body of which is soldered to the metal substrate without using bolts, and a radiation plate having a coupling unit adapted in such a manner that the metal substrate, which has the body of the heating device coupled thereto, can be coupled to the coupling unit using bolts for simplification of the assembly process.

In order to accomplish these objects, there is provided an electronic control device for an electric power steering apparatus having an electronic control device for controlling motor current based on electric signals inputted from a torque sensor of an automobile and a motor for generating steering power, the electronic control device including a PCB; a metal substrate formed on a lower side of the PCB in a plate shape while being perpendicular to the PCB; a heating device having a terminal coupled to the PCB and a body coupled to a front surface of the metal substrate; and a radiation plate spaced a predetermined distance from the PCB and having a coupling unit formed on an upper surface of the radiation plate, the metal substrate being coupled to the coupling unit.

In accordance with another aspect of the present invention, there is provided an electric power steering apparatus for an automobile including a pinion shaft connected to a steering wheel of the automobile and having a pinion gear formed on a side thereof; a rack bar connected to both wheels of the automobile and having a rack gear formed on a side thereof to engage with the pinion gear; a torque sensor for sensing steering torque applied to the steering wheel and outputting an electric signal; a velocity sensor for sensing velocity of the automobile and outputting an electric signal; an electronic control device for generating a control signal based on the electrical signals from the toque sensor and the velocity sensor; and a motor for generating steering power based on the control signal from the electronic control device, the electronic control device including a PCB; a metal substrate formed on a lower side of the PCB in a plate shape while being perpendicular to the PCB; a heating device having a terminal coupled to the PCB and a body coupled to a front surface of the metal substrate; and a radiation plate spaced a predetermined distance from the PCB and having a coupling unit formed on an upper surface of the radiation plate, the metal substrate being coupled to the coupling unit.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3A:
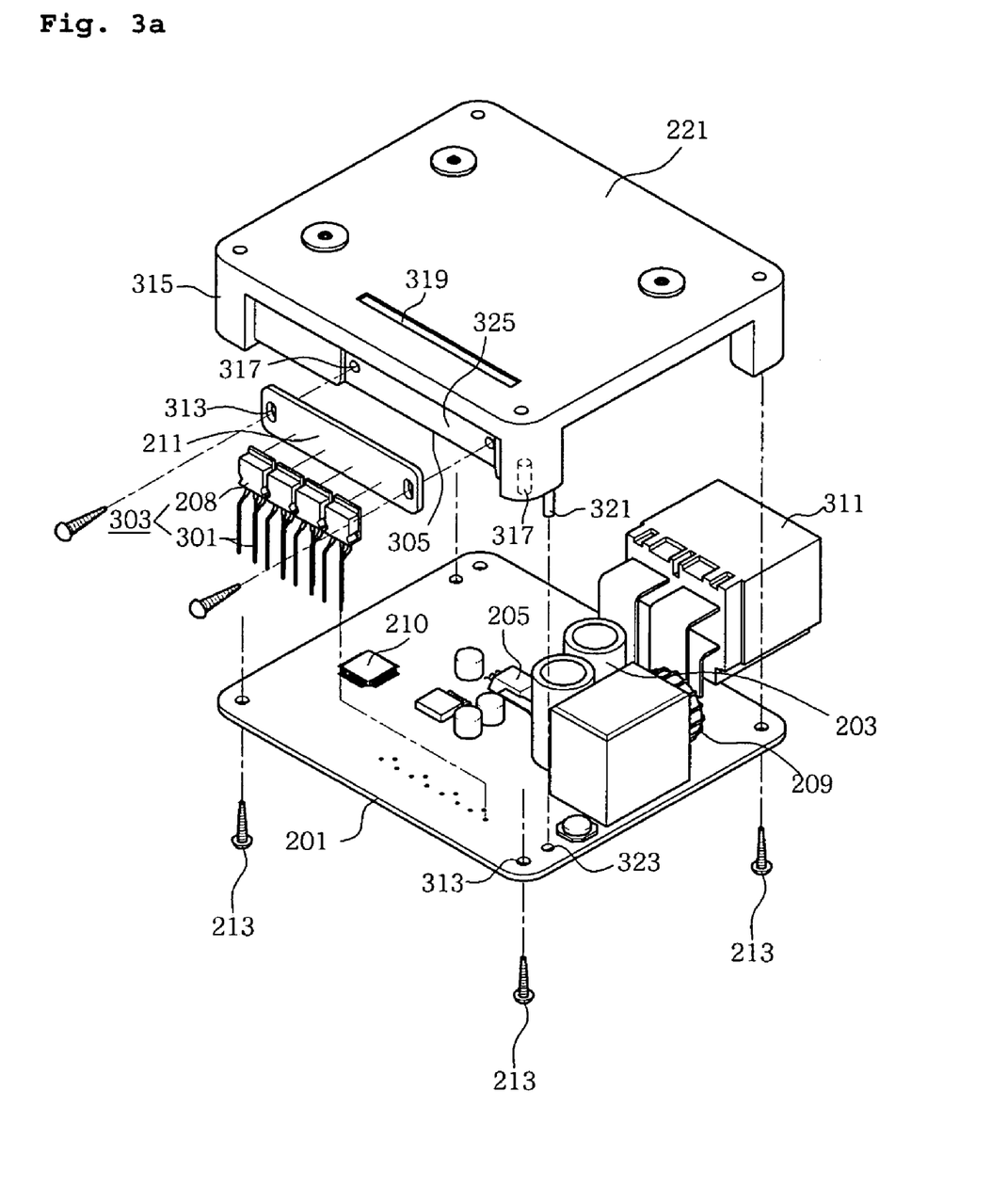
FIG. 3a is an exploded perspective view briefly showing an electronic control device according to a preferred embodiment of the present invention.
Figure 3B:
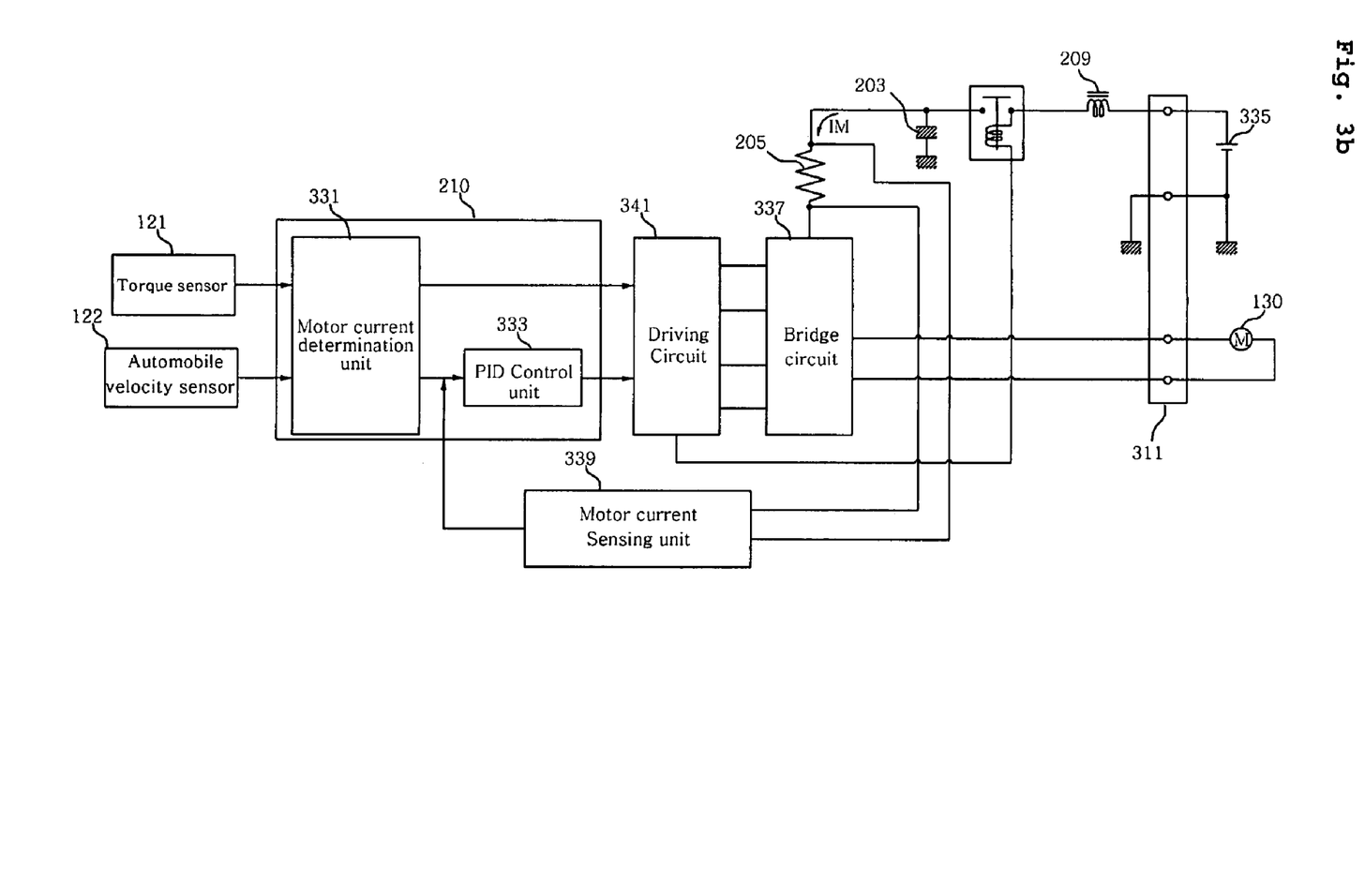
FIG. 3b shows a circuit diagram of an electronic control device according to a preferred embodiment of the present invention.

FIG. 3a is an exploded perspective view briefly showing an electronic control device according to a preferred embodiment of the present invention, and FIG. 3b shows a circuit diagram of the electronic control device according to a preferred embodiment of the present invention.

As shown in FIGS. 3a and 3b, the electronic control device according to a preferred embodiment of the present invention includes a PCB 201; a plate-shaped metal substrate 211 positioned on top of the PCB 201 while being perpendicular to the PCB 201; a heating device 303 having a terminal 301 coupled to the PCB 301 and a body 208 coupled to the front surface of the metal substrate 211; and a radiation plate 221 spaced a predetermined distance from the PCB 201 and having a coupling unit 305, to which the metal substrate 211 is coupled, positioned on the bottom surface thereof.

The PCB 201 has a wiring pattern formed on a surface thereof so that a microcomputer 210, a capacitor 203, a shunt resistor 205, and a coil 209 are mounted on the PCB 201 via their terminals, which are soldered to the wiring pattern, respectively.

The PCB 201 has a connector 311 mounted on a side thereof, in order to connect a motor 130 and a battery 335, which supplies motor current IM for driving the motor 130, to a bridge circuit 337. The bridge circuit 337 is composed of a plurality of switching devices to switch the motor current IM based on the size and direction of steering power.

The microcomputer 210 calculates steering power, based on steering torque and the automobile's velocity, and generates a control signal, based on the calculated steering power. The microcomputer 210 includes a motor current determination unit 331 for generating commands regarding rotational direction of the motor 130 and motor current (IM), based on the steering power, and a PID control unit 333.

Upon receiving a current control signal from the microcomputer 210, a drive circuit 341 drives the motor 130 using the bridge circuit 337.

The capacitor 203 is adapted to absorb a ripple current component included in the motor current IM and has an electrostatic capacity of about 3600 µF.

The shunt resistor 205 has a motor current sensing unit 339 positioned on an end thereof to sense the motor current IM.

Meanwhile, the shunt resistor 205 has a problem in that it generates excessive heat. In order to avoid this problem, an inexpensive current sensor (not shown) may be positioned between the bridge circuit 337 and the connector 311, as shown in FIG. 3b, to replace the shunt resistor 205.

The PCB 201 has coupling holes 313 formed on corners thereof so that the PCB 201 can be coupled to posts 315 of the radiation plate 221 by bolts 213, as will be described later. The PCB 201 may have pin coupling holes 323 spaced a predetermined distance from the coupling holes 313 so that coupling pins 321 of the posts 315 can be inserted therein, as will be described later.

The heating device 303 includes a terminal 301 and a body 208. The heating device 303 may be any type of electronic device, including an FET, which consumes much power.

The terminal 301 connects the heating device 303 to the PCB 201 and supplies the body 208 with current. When the heating device 303 is to be mounted on the PCB 201, the terminal 301 is positioned so as to extend through the PCB 201 from a surface of the PCB 201 and an end of the terminal 301, which protrudes from the other surface of the PCB 201, is soldered to fix the terminal 301 to the PCB 201.

The body 208 is adapted to perform a predetermined function when the heating device 303 is supplied with current. The body 208 is coupled to the metal substrate 211 to radiate heat occurring during operation, as will be described later.

Figure 4:
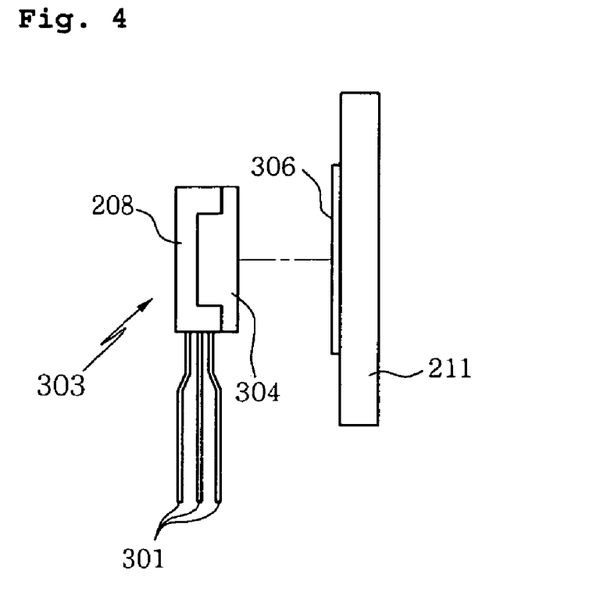
FIG. 4 is a sectional view showing a process for soldering a heating device to a metal substrate.

FIG. 4 is a sectional view showing a process for soldering the heating device to the metal substrate.

According to the prior, the body 208 is coupled to the metal substrate 211 by forming coupling holes on a side of the body 208, forming bolt holes on the metal substrate, and coupling the body 208 to the metal substrate 211 using bolts.

According to the present invention, as shown in FIG. 4, the body 208 is coupled to the metal substrate 211 by positioning a metal plate 304 on a side of the body 208, applying solder 306 to the front surface of the metal substrate 211, and soldering the metal plate 304 to the metal substrate 211.

Comparing the prior art with the present invention, the assembly process is shorter and simper in the latter case. More particularly, in the case of the prior art, each heating device 303 is fixed to the metal substrate 211 using bolts one by one and, when a large number of heating devices 303 are used, the assembly process is inevitably complicated and prolonged. In contrast, in the case of the present invention, the heating device 303 is simply soldered to the metal substrate 211.

The metal substrate 211 transmits heat from the heating device 303 to the radiation plate 221. The metal substrate 211 has the shape of a plate and is positioned on top of the PCB 201 while being perpendicular to the PCB 201. The body 208 of the heating device 303 is coupled to the front surface of the metal substrate 211. The metal substrate 211 is preferably made of metal having good thermal conductivity, such as aluminum or copper, so that heat can be rapidly transmitted from the heating device 303 to the radiation plate 221.

The metal substrate 211 has coupling holes 313 formed on corners thereof, through which bolts 213 extend, and the radiation plate 221 has bolt holes 317 formed on its coupling unit 305, as will be described later, so that the metal substrate 211 can be coupled to the front surface of the coupling unit 305 with the bolts 213.

The radiation plate 221 is adapted to radiate heat, which is transmitted via the metal substrate 211, into the air quickly. The radiation plate 221 has a coupling unit 305 and posts 315 positioned on its bottom surface and is spaced a predetermined distance from the PCB 201. The radiation plate 221 is preferably made of metal having good thermal conductivity, such as aluminum or copper, so that heat can be radiated from the heating device 303 into the air quickly.

Figure 5:
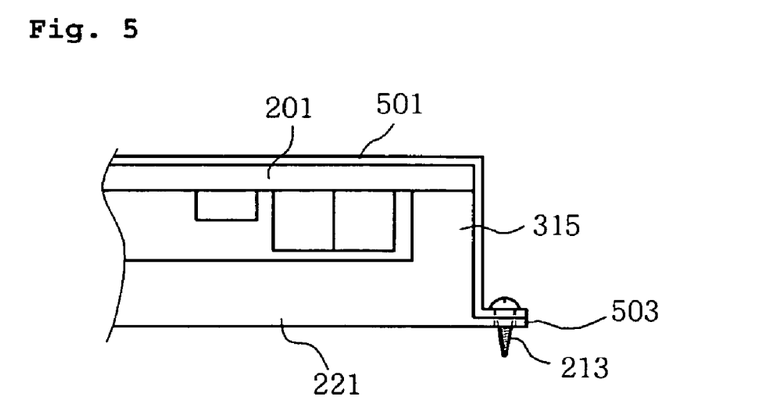
FIG. 5 is a lateral sectional view showing a process for mounting a substrate case on a radiation plate.

FIG. 5 is a lateral sectional view showing a process for mounting a substrate case on the radiation plate.

As shown in FIG. 5, a substrate case 501, which is adapted to enclose the PCB 201 from above, is coupled to a coupling step 503, which protrudes from the bottom of the radiation plate 221 in the lateral direction, using bolts 231 so that various devices mounted on the PCB 201 are protected.

Alternatively, the bolts 213 may be coupled to the radiation plate 221 in the lateral direction without using the coupling step 503.

The coupling unit 305 protrudes from a side of the bottom surface of the radiation plate 221 and has bolt holes 317 formed on the front surface thereof so that the metal substrate 211 can be coupled to the front surface of the coupling unit 305 with bolts 213.

The coupling unit 305 may have a mounting groove 325 formed on the front surface thereof in a shape corresponding to that of the metal substrate 211 so that the metal substrate 211 can be fastened to the coupling unit 305 by seating the metal substrate 211 in the mounting groove 325.

The coupling unit 305 acts as a path along which heat is transmitted from the heating device 303 to the radiation plate 221. Therefore, the coupling unit 305 must quickly radiate generated heat, as well as quickly transmit the heat to other parts of the radiation plate 221.

Figure 6:
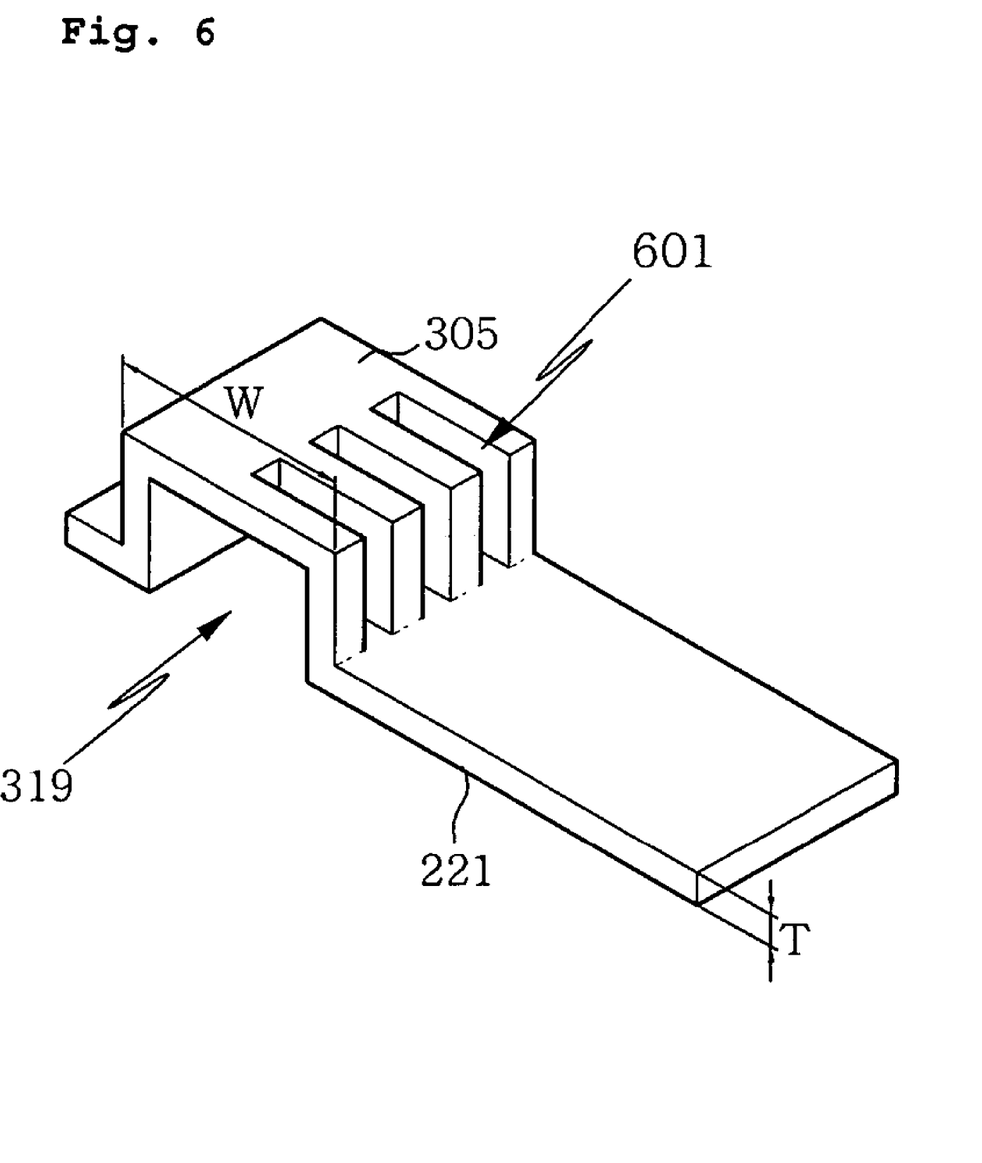
FIG. 6 is a partially-broken perspective view showing a coupling unit formed on a radiation plate.

FIG. 6 is a partially-broken perspective view showing the coupling unit formed on the radiation plate.

As shown in FIG. 6, the coupling unit 305 may have protrusions 601 formed on the rear or bottom surface thereof, in order to increase the surface area of the coupling unit 305, which is in contact with air, and improve heat radiation effect. Alternatively, the coupling unit 305 may have a radiation groove 319 formed on the bottom surface thereof with a predetermined depth, in order to improve heat radiation effect.

According to the prior art, increase in the thickness of the radiation plate 221 for better heat radiation is limited by spatial restrictions. In contrast, according to the present invention, the thickness W of the radiation plate 221 can be increased as desired by increasing the width W of the coupling unit 305 to the same degree. As a result, the heat radiation effect can be improved without any spatial restrictions.

The posts 315 protrude a predetermined length from corners of the bottom surface of the radiation plate 221 and have bolt holes 317 formed on the inner portion thereof so that the PCB 201, which is provided with coupling holes 313, can be fixed to the posts 315 with bolts 213. The radiation plate 221 is usually square and preferably has four posts 315, but the number is not limited to that herein.

The posts 315 may have coupling pins 321 formed on the top thereof with a predetermined length to be inserted into the pin coupling holes 323 formed on the PCB 201. This is advantageous in that, when the PCB 201 and the radiation plate 221 are to be coupled to each other, they can be fixed to each other before using bolts 213. In addition, the coupling holes 313 of the PCB 201 and the bolt holes 317 of the posts 315 are automatically aligned with each other so that bolts 213 can be coupled thereto more easily.

Furthermore, coupling between the coupling pins 321 and the pin coupling holes 323 enhances the coupling between the PCB 201 and the posts 315.

As mentioned above, the electronic control device according to the present invention is advantageous in that the metal substrate and radiation plate are stacked in such a manner that heat can be effectively radiated from the heating device.

In addition, the width of the coupling unit can be increased as desired, without any spatial restrictions, to improve heat radiation effect.

Furthermore, the body of the heating device is soldered to the metal substrate, which is then fixed to the coupling unit of the radiation plate with bolts. This simplifies the assembly process.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An electric power steering apparatus having an electronic control device for controlling motor current based on electric signals inputted from a torque sensor of an automobile and a motor for generating steering power, the electronic control device comprising:

a PCB;

a radiation plate spaced a predetermined distance from the PCB and having at least a first post and a second post both protruding a predetermined length from a surface of the radiation plate, each of the first post and the second post including a bolt hole formed on an inner portion of the post, the PCB being coupled to the post of the radiation plate by a bolt inserted into the coupling hole, the radiation plate including a coupling unit formed integrally with the radiation plate, the coupling unit being disposed between the first post and the second post;

a metal substrate disposed on a side portion of the PCB in a plate shape, a first surface and a second surface of the metal substrate being perpendicular to the PCB, the first surface of the metal substrate being coupled to the coupling unit; and a heating device mounted on the PCB and having
- a terminal coupled to the PCB and
- a body coupled to the second surface of the metal substrate.

2. The electric power steering apparatus as claimed in claim 1, wherein the body of the heating device is coupled to the metal substrate by soldering.

3. The electric power steering apparatus as claimed in claim 2, wherein the metal substrate has a coupling hole formed thereon, the radiation plate has a bolt hole formed on the coupling unit, and the metal substrate is coupled to the coupling unit by a bolt inserted into the coupling hole and the bolt hole.

4. The electric power steering apparatus as claimed in claim 3, wherein the coupling unit has a radiation groove formed on a bottom surface thereof with a predetermined depth and protrusions formed on a bottom surface thereof.

5. The electric power steering apparatus as claimed in claim 1, wherein the post has a coupling pin protruding a predetermined length and the PCB has a pin coupling hole formed thereon, the coupling pin being inserted into the pin coupling hole.

6. The electric power steering apparatus as claimed in claim 5, wherein the radiation plate has at least two posts.

7. The electric power steering apparatus as claimed in claim 6, wherein the heating device is a field effect transistor.

8. The electric power steering apparatus as claimed in claim 7, wherein a substrate case is coupled to an upper surface of the PCB.

* * * * *